(12) United States Patent
Park et al.

(10) Patent No.: US 10,580,617 B2
(45) Date of Patent: Mar. 3, 2020

(54) METHOD AND APPARATUS FOR PLASMA ETCHING

(71) Applicant: Samsung Electronics Co., Ltd., Suwon-si (KR)

(72) Inventors: Kijong Park, Yongin-si (KR); Jun-Youl Yang, Seoul (KR); Yongsun Ko, Suwon-si (KR); Kyunghyun Kim, Seoul (KR); Taeheon Kim, Busan (KR); Jae Jin Shin, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 113 days.

(21) Appl. No.: 15/841,230

(22) Filed: Dec. 13, 2017

(65) Prior Publication Data

US 2018/0102235 A1 Apr. 12, 2018

Related U.S. Application Data

(62) Division of application No. 15/133,989, filed on Apr. 20, 2016, now Pat. No. 10,096,453.

(30) Foreign Application Priority Data

Jan. 20, 2016 (KR) .......................... 10-2016-0006955

(51) Int. Cl.
*H01J 37/32* (2006.01)
(52) U.S. Cl.
CPC .... *H01J 37/32009* (2013.01); *H01J 37/3299* (2013.01); *H01J 37/32449* (2013.01); *H01J 37/32899* (2013.01); *H01J 37/32926* (2013.01); *H01J 37/32935* (2013.01); *H01J 2237/334* (2013.01)

(58) Field of Classification Search
CPC ............ H01J 37/32009; H01J 37/3299; H01J 37/32935; H01J 37/32926; H01J 37/32899; H01J 37/32449; H01J 2237/334
See application file for complete search history.

(56) References Cited

U.S. PATENT DOCUMENTS 6,218,196 B1 4/2001 Ise et al.
6,855,567 B1 2/2005 Ni et al.
(Continued)

FOREIGN PATENT DOCUMENTS

KR 10-0410992 12/2003
KR 10-1276262 6/2013

OTHER PUBLICATIONS

Notice of Allowance dated May 31, 2018, in U.S. Appl. No. 15/133,989.
(Continued)

*Primary Examiner* — Duy Vu N Deo
(74) *Attorney, Agent, or Firm* — H.C. Park & Associates, PLC

(57) ABSTRACT

A plasma etching apparatus includes an etching chamber and at least one processor. The etching chamber is configured to support a target therein. The at least one processor is configured to: determine a process condition for plasma etching the target before execution of a plasma etching process; and control an aspect of the chamber according to the process condition. The process condition includes a unit etching time over which the plasma etching process is to be continuously performed.

8 Claims, 8 Drawing Sheets

(56) References Cited

U.S. PATENT DOCUMENTS

| | | |
|---|---|---|
| 6,897,119 B1 | 5/2005 | Sneh et al. |
| 6,955,177 B1 | 10/2005 | Chiu et al. |
| 7,067,440 B1 | 6/2006 | Bayman et al. |
| 7,481,943 B2 | 1/2009 | McAvoy et al. |
| 7,482,278 B1 | 1/2009 | Ying et al. |
| 7,759,249 B2 | 7/2010 | Balasubramaniam |
| 7,851,239 B2 | 12/2010 | Webster et al. |
| 8,247,321 B2 | 8/2012 | Matsumoto et al. |
| 8,263,502 B2 | 9/2012 | Lee |
| 8,415,258 B2 | 4/2013 | Akae et al. |
| 8,679,983 B2 | 3/2014 | Wang et al. |
| 9,017,571 B2 | 4/2015 | Umezaki et al. |
| 9,054,017 B2 | 6/2015 | Saxler et al. |
| 9,165,783 B2 | 10/2015 | Nemani et al. |
| 9,234,133 B2 | 1/2016 | Takada et al. |
| 2003/0114011 A1 | 6/2003 | Kagoshima et al. |
| 2004/0007325 A1* | 1/2004 | Pan .............. H01L 21/67161 156/345.1 |
| 2004/0259328 A1 | 12/2004 | Ito et al. |
| 2006/0011583 A1 | 1/2006 | Bailey et al. |
| 2007/0026630 A1 | 2/2007 | Kim et al. |
| 2007/0224825 A1 | 9/2007 | Xiao et al. |
| 2007/0224827 A1 | 9/2007 | Xiao et al. |
| 2008/0142039 A1 | 6/2008 | Chen et al. |
| 2010/0047519 A1 | 2/2010 | Lee et al. |
| 2010/0129994 A1 | 5/2010 | Awad et al. |
| 2013/0029494 A1 | 1/2013 | Sasaki et al. |
| 2014/0273492 A1 | 9/2014 | Anthis et al. |
| 2015/0000695 A1 | 1/2015 | Noda et al. |
| 2015/0093903 A1 | 4/2015 | Aoyama |
| 2015/0147488 A1 | 5/2015 | Choi et al. |
| 2016/0148851 A1* | 5/2016 | Okamoto ........ H01L 21/32136 438/9 |
| 2017/0084505 A1* | 3/2017 | Seddon ............ H01L 23/49827 |

OTHER PUBLICATIONS

Non-Final Office Action dated Mar. 30, 2017, issued in the U.S. Appl. No. 15/133,989.

Notice of Allowance dated Sep. 27, 2017, issued in the U.S. Appl. No. 15/133,989.

* cited by examiner

METHOD AND APPARATUS FOR PLASMA ETCHING

CROSS-REFERENCE TO RELATED APPLICATIONS

This application is a Division of U.S. patent application Ser. No. 15/133,989, filed on Apr. 20, 2016, and claims priority from and the benefit of Korean Patent Application No. 10-2016-0006955, filed on Jan. 20, 2016, which is hereby incorporated by reference for all purposes as if fully set forth herein.

BACKGROUND

Field

Exemplary embodiments relate to device fabrication, and, more particularly, to a method and apparatus for plasma etching.

Discussion

Within the realm of semiconductor device fabrication, plasma etching may be used to form a pattern on or in a substrate. That is, plasma etching may be utilized to pattern the bulk of a substrate or to pattern one or more layers formed on the substrate, such as one or more conductive and/or dielectric layers. As such, a semiconductor fabrication process may include the formation of a material layer on a substrate via a deposition process, an exposure process to form a mask pattern in the material layer, and a plasma etching process to selectively etch underlying material utilizing the mask pattern. Plasma etching may provide relatively finer resolution than other conventional etching techniques.

Plasma etching typically involves the formation of a plasmarized (i.e., ionized) reactive gas in a chamber containing a specimen to be etched. The ionized reaction gas diffuses toward the specimen to enable chemisorption to occur between reactive particles of the plasma and a material surface of the specimen exposed via a masking layer. Reactions produce desorbed molecules that diffuse back into a mainstream etchant flow to be removed from the chamber. In this manner, the exposed material surface may be etched according to a pattern of the masking layer; however, the resolution of the resulting pattern may be affected by the etching selectivity between the exposed material and a material of the masking layer. As such, improvements in etching selectivity may enable increases in pattern resolution.

The above information disclosed in this Background section is only for enhancement of understanding of the background of the inventive concept, and, therefore, it may contain information that does not form the prior art that is already known in this country to a person of ordinary skill in the art.

SUMMARY

One or more exemplary embodiments provide a plasma etching apparatus configured to improve etching selectivity.

One or more exemplary embodiments provide a plasma etching method to improve etching selectivity.

Additional aspects will be set forth in the detailed description which follows, and, in part, will be apparent from the disclosure, or may be learned by practice of the inventive concept.

According to one or more exemplary embodiments, a plasma etching apparatus includes: an etching chamber configured to support a target therein; and at least one processor configured to: determine a process condition for plasma etching the target before execution of a plasma etching process; and control an aspect of the etching chamber according to the process condition, wherein the process condition includes a unit etching time over which the plasma etching process is to be continuously performed.

According to one or more exemplary embodiments, a method includes: receiving metrological etching information associated with a target; determining, in association with an etching initiation process, a condition to control plasma etching of the target based on the metrological etching information; executing, after determining the condition, the plasma etching according to the condition, wherein the condition includes a unit etching time over which the plasma etching is to be continuously performed.

According to one or more exemplary embodiments, a method includes: receiving input to control plasma etching of a first layer, the input comprising design criteria and information about the first layer and a second layer; determining, based on some of the input, a first time to plasma etch the first layer; determining, based on the information, a second time to continuously plasma etch the first layer with the second layer in an incubation state; and causing, at least in part, the plasma etch to be performed according to the second time. The plasma etch is repeated k times with k multiples of the second time equaling the first time.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1A:
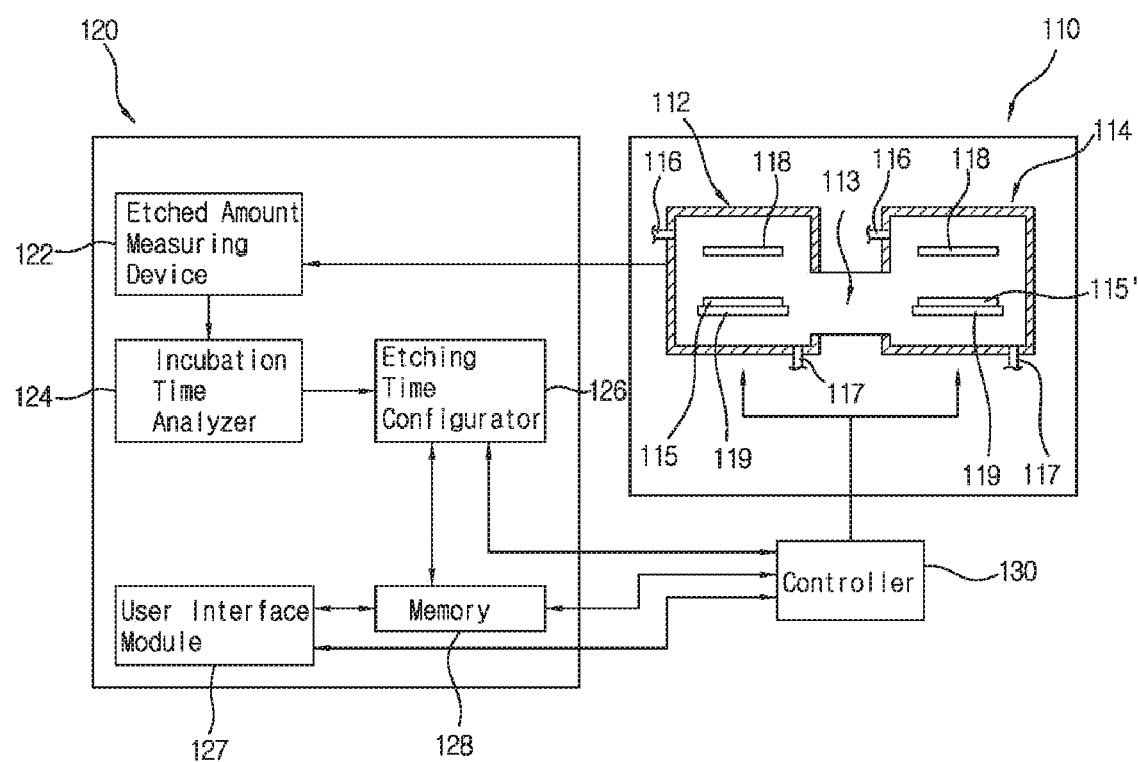
FIG. 1A is a block diagram of a plasma etching apparatus, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, and/or aspects of the various illustrations may be otherwise combined, separated, interchanged, and/or rearranged without departing from the disclosed exemplary embodiments. In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," "underlying," "overlaying," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments may be described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
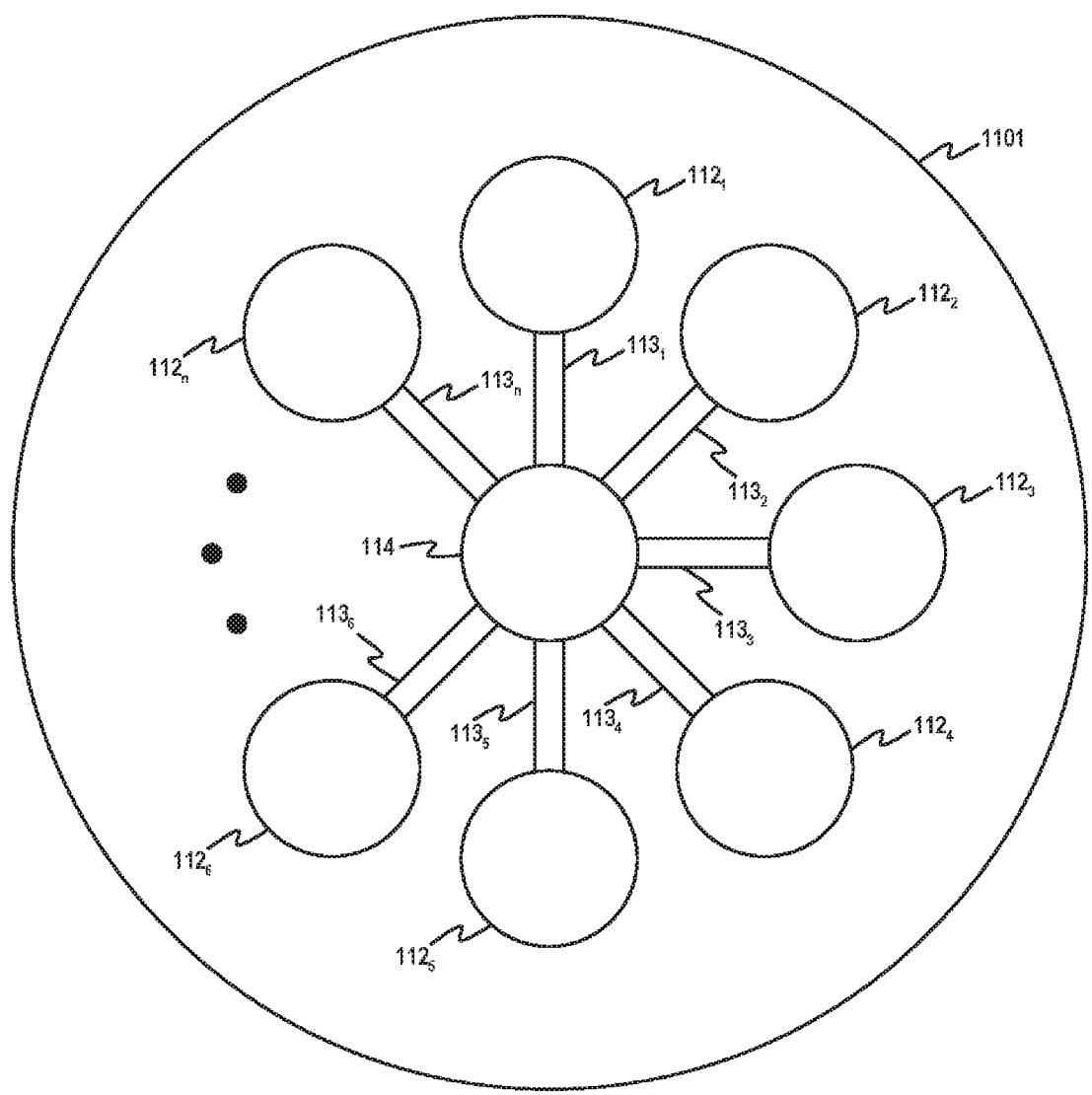
FIGS. 1B and 1C are block diagrams of layout views of plasma etching apparatuses, according to one or more exemplary embodiments.
Figure 1C:
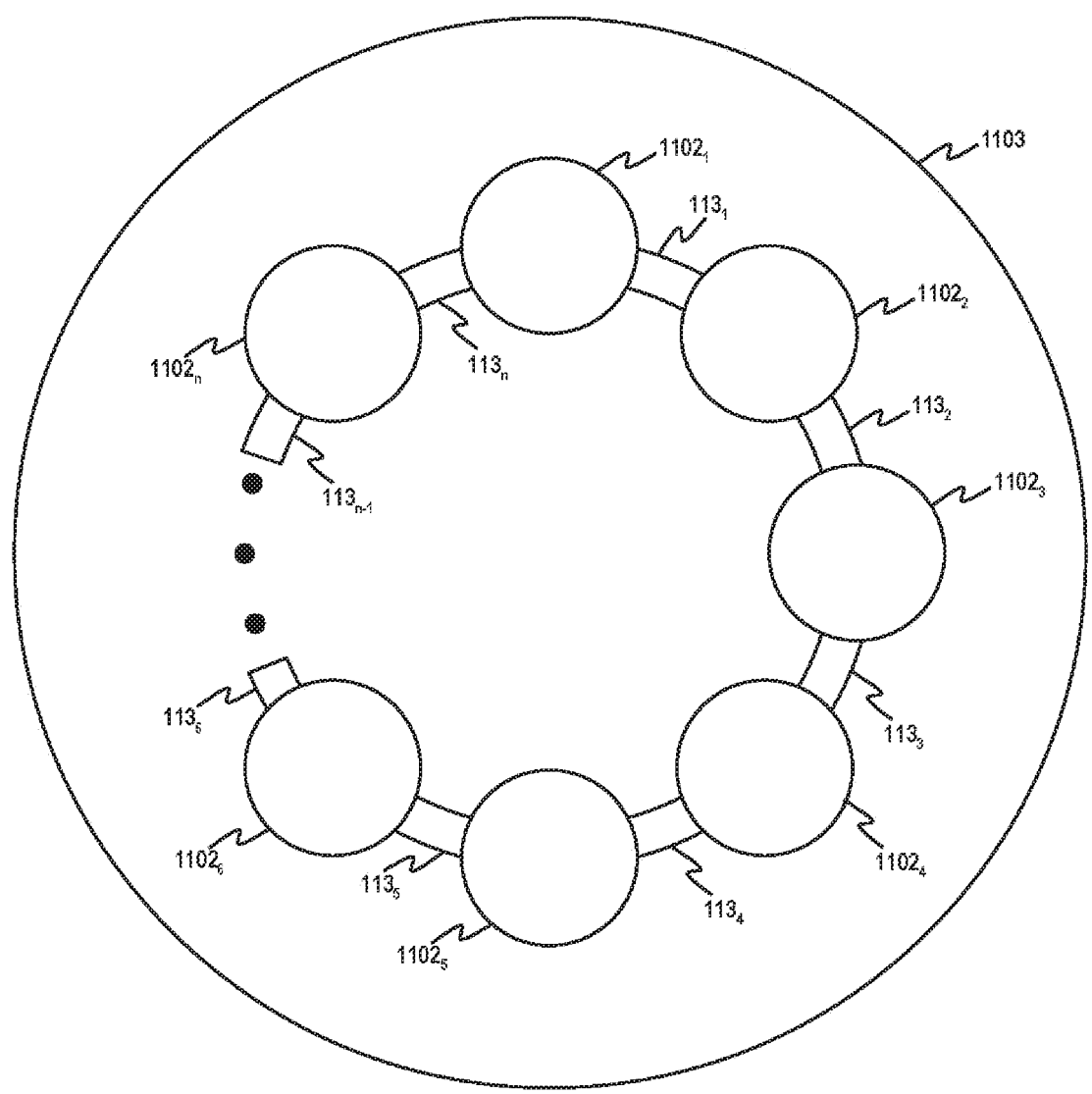

FIGS. 1A, 1B, and 1C are respective block diagrams of a plasma etching apparatus, according to one or more exemplary embodiments.

Referring to FIG. 1A, plasma etching apparatus 100 may include etching chamber 110 configured to carry out an etching process and an etching initiation process to an etching target layer, processor 120 configured to determine condition(s) of the etching process for etching chamber 110 before execution of the etching process, and controller 130 configured to control etching chamber 110 according to the conditions set up by processor 120.

Etching chamber 110 may include first chamber 112, second chamber 114, and connection channel 113 connecting first chamber 112 and second chamber 114. First chamber 112 and second chamber 114 may be vacuum process chambers for semiconductor fabrication using plasma etching techniques. First chamber 112 and second chamber 114 may be configured to perform an etching process and an etching initiation process. For example, first chamber 112 may be configured to carry out the etching process and second chamber 114 may be configured to carry out the etching initiation process. Furthermore, first chamber 112 may be configured to carry out the etching process with respect to a first substrate, while second chamber 114 may be configured to carry out the etching initiation process with respect to a second substrate. Exemplary embodiments, however, are not limited thereto. For instance, first chamber 112 may be configured to carry out the etching initiation process and the second chamber 114 may be configured to carry out the etching process. As another example, first chamber 112 and second chamber 114 may each be configured to carry out both the etching process and the etching initiation process.

It is also contemplated that first chamber 112 and second chamber 114 may define portions of an etching apparatus 1101 including a plurality of sub-chambers, e.g., first sub-chambers $112_1$, $112_2$, $112_3$, ..., and $112_n$ and second sub-chamber 114, such as illustrated in FIG. 1B. As another example, In this manner, a substrate to be plasma etched to a target depth may cycle through the plurality of first sub-chambers $112_1$, $112_2$, $112_3$, . . . , and $112_n$, such that each of the plurality of first sub-chambers $112_1$, $112_2$, $112_3$, . . . , and $112_n$ conducts a sub-plasma etching process that, when combined with the sub-plasma etching processes of the other first sub-chambers, eventually achieves the target etch depth.

According to one or more exemplary embodiments, the plurality of first sub-chambers $112_1$, $112_2$, $112_3$, . . . , and $112_n$ may be disposed about a central second sub-chamber 114, such that each of the plurality of first sub-chambers $112_1$, $112_2$, $112_3$, . . . , and $112_n$ is connected to the central second sub-chamber 114 via a corresponding connection channel, e.g., one of connection channels $113_1$, $113_2$, $113_3$, . . . , and $113_n$. To this end, the etching process may be performed at the plurality of first sub-chambers $112_1$, $112_2$, $112_3$, . . . , and $112_n$ and the etching initiation process may be performed at the central second sub-chamber 114. Exemplary embodiments, however, are not limited thereto. For instance, an etching apparatus 1103 may include a plurality of sub-chambers $1102_1$, $1102_2$, $1102_3$, . . . , and $1102_n$ connected to one another via a plurality of connection channels $113_1$, $113_2$, $113_3$, . . . , and $113_n$, such as illustrated in FIG. 1C. In this manner, each of the plurality of sub-chambers $1102_1$, $1102_2$, $1102_3$, . . . , and $1102_n$ may be configured to perform the etching process and the etching initiation process. It is noted that sub-chamber $1102_n$ may or may not be connected to sub-chamber $1102_1$.

Etching apparatuses 1101 and 1103 may enable multiple substrates to be processed at the same time to provide various manufacturing efficiencies. To this end, a substrate may iterate through a plurality of first sub-chambers $112_1$, $112_2$, $112_3$, . . . , and $112_n$, while alternating between a first sub-chamber and the second sub-chamber 114 (as in FIG. 1B), or iterate through a plurality of sub-chambers $1102_1$, $1102_2$, $1102_3$, . . . , and $1102_n$ (as in FIG. 1C). In this manner, a manufacturing process line may achieve the target depth once a substrate iterates through either the plurality of first sub-chambers $112_1$, $112_2$, $112_3$, . . . , and $112_n$ in FIG. 1B, or the plurality of sub-chambers $1102_1$, $1102_2$, $1102_3$, . . . , and $1102_n$ in FIG. 1C. It is also contemplated that a substrate may iterate through the plurality of first sub-chambers $112_1$, $112_2$, $112_3$, . . . , and $112_n$, or the plurality of sub-chambers $1102_1$, $1102_2$, $1102_3$, . . . , and $1102_n$ for a determined number of iteration revolutions to achieve a target etch depth.

For descriptive convenience, etching chamber 110 will be described with reference FIG. 1A including first chamber 112 being configured to carry out the etching process and second chamber 114 being configured to carry out the etching initiation process. In this manner, first chamber 112 may enable the plasma etching process, during which a targeted material layer disposed on substrate 115 is to be etched, and second chamber 114 may enable the etching initiation process, during which an etching byproduct created during the plasma etching process can be eliminated, e.g., pumped out of (or otherwise purged from) second chamber 114.

First chamber 112 and second chamber 114 may respectively include gas inlet 116 and gas outlet 117, top electrode 118 configured to deliver high frequency power to plasmarize (i.e., ionize) the inlet gas into a plasma state, and substrate support 119. Gas inlet 116 of first chamber 112 may be configured to introduce an etching gas, and gas inlet 116 of second chamber 114 may be configured to introduce purging gas to purge the etching byproduct.

Top electrode 118 may be disposed in both of first chamber 112 and second chamber 114, and may be a flat electrode configured to provide high frequency power having a frequency substantially between 60 MHz and about 200 MHz. It is contemplated, however, that any suitable high frequency power rating may be utilized in association with exemplary embodiments described herein. Substrate support 119 may be disposed facing and parallel to top electrode 118. Substrate support 119 may be configured to support substrate 115 upon which an etching target layer (or material) is disposed.

Substrate support 119 may be a lower electrode corresponding to top electrode 118. Accordingly, substrate support 119 included in first chamber 112 may be provided with a low frequency bias power having a frequency substantially between 2 MHz and 13.56 MHz, and substrate support 119 included in the second chamber 114 may be provided with a high frequency power having a frequency substantially between 60 MHz and 200 MHz.

First chamber 112 and second chamber 114 maybe connected by connection channel 113. Connection channel 113 may be a vacuum internal space. Substrate 115 may be transferred from first chamber 112 to second chamber 114 after the etching process through the connection channel 113, and, thereby, subjected to the etching initiation process. Similarly, after the etching initiation process is carried out, a substrate 115' may also be transferred from second chamber 114 to first chamber 112 through connection channel 113 to carry out (or continue with) the etching process.

Although not illustrated, first chamber 112 and/or second chamber 114 may include a substrate inlet through which substrate 115 enters into the interior space of first chamber 112 or second chamber 114. To this end, first chamber 112 and/or second chamber 114 may include a substrate outlet through which substrate 115 is removed from the interior space of first chamber 112 or second chamber 114. As such, separate gate valves may be utilized in the substrate inlet(s) and substrate outlet(s) to help maintain a vacuum state in first chamber 112 and second chamber 114 during etching initiation, etching, and purging processes.

Referring to FIG. 1A, etching chamber 110 includes two chambers, but exemplary embodiments are not limited thereto. That is, etching chamber 110 may include one chamber, and, as such, the etching process and the etching initiation process may be alternatingly carried out in the chamber. To this end, etching chamber 110 may include any suitable number of chambers and/or connection channels.

Processor 120 may be configured to determine one or more conditions of the etching process for etching chamber 110 before execution of the etching process. It is contemplated, however, that processor 120 may be configured to affect the etching process in real-time via controller 130. That is, processor 120 may monitor etching conditions and affect the etching process in situ. The condition of the etching process may include a type of etching gas (or combination of etching gasses) introduced to first chamber 112, internal pressure and temperature of first chamber 112, a power of the high frequency power applied to top electrode 118, and etching time carried out in first chamber 112. It is also contemplated that processor 120 may be configured to affect one or more conditions associated with second chamber 114 affecting desorbed molecule purging and etching initiation processes.

According to one or more exemplary embodiments, the conditions of the etching process includes a unit etching time during which the etching process may be carried out (e.g., continuously carried out) in first chamber 112.

Referring to FIG. 1A, processor 120 includes etched amount measuring device 122, incubation time analyzer 124, etching time configurator 126, user interface 127, and memory 128. Etched amount measuring device 122 may be configured to analyze the etched amount of at least two material layers disposed in first chamber 112. Incubation time analyzer 124 may be configured to analyze an incubation time of each material layer in response to the etched amount analysis result from etched amount measuring device 122. Etching time configurator 126 may be configured to set the unit etching time during which the etching process may be carried out in first chamber 112 in response to the incubation time of each of the material layers.

User interface module 127 may be configured to provide a user interface to the various features and functions of plasma etching apparatus 100, as well as configured to receive the process condition including, but not limited to, a total etching time (which may define an etching time requested to form the pattern), and the unit etching time. For instance, user interface module 127 may be configured to provide at least one graphical user interface (GUI) to facilitate user interaction with the various components of plasma etching apparatus 100, e.g., controller 130 and etching chamber 110. User interface module 127 may include (or otherwise be associated with) an input device (e.g., touch screen, keyboard, mouse, etc.) through which an operator may input the process condition and a screen through which the received process condition may be shown.

Memory 128 may be configured to receive and store the process condition (or information associated therewith). Memory 128 may receive the process condition from etching time configurator 126 and user interface module 127 and store the process condition. For instance, memory 128 may store the unit etching time in association with other process conditions including material layers, etching gas, pressure of first chamber 112, applied high frequency power, etc. In this manner, memory 128 may provide historical data that may be utilized in association with determining the unit etching time for materials to be etched. Furthermore, user interface module 127 may enable data in memory 128 to be selected in order to select process conditions based on materials to be etched. To this end, user interface module 127 may be configured to interface with one or more manufacturing databases (not shown) including information (e.g., design data) about a pattern to be formed on substrate 115, as well as the existing condition information of substrate 115, e.g., data about existing layers, holes, patterns, etc., already formed on substrate 115. In this manner, user interface module 127 may be configured to extract data from the manufacturing databases and/or receive information from a user about, for instance, a total etch depth and materials of layers to be etched. As such, user interface module 127 may be configured, in association with one or more components of processor 120, to automatically determine the process condition(s) to be provided to memory 128 and/or controller 130.

Controller 130 may be configured to control various aspects of first chamber 112 and second chamber 114 included as part of etching chamber 110 according to the process conditions set up by processor 120, which includes the unit etching time set by processor 120. Controller 130 may also be configured to control various aspects of first chamber 112 and second chamber 114 according to the process conditions received by user interface module 127 and/or the process conditions stored in memory 128. For instance, controller 130 may receive process conditions including material layers, etching gas, a pressure in the chamber, applied high frequency power, etc., from user interface module 127, and receive the unit etching time associated with the process conditions from memory 128.

The at least two material layers may be material layers configured to react to the ionized etching gas introduced into first chamber 112, and the at least two material layers may include a first material layer that is the etching target material and a second material layer that may provide a guide a pattern on the first material layer (e.g., mask pattern). As previously mentioned, etching resolution may be increased with increasing etching selectivity, which refers to a ratio of etch rates of the first material layer and the second material layer. In this manner, the etching process may be more efficient as the ratio of the etch rate of the first material layer to the etch rate of the second material layer increases. Change in the etching selectivity may result in a decrease in a stability of the etching process.

According to one or more exemplary embodiments, processor 120 may be configured to set the unit etching time to increase the etching selectivity of the etching process carried out in first chamber 112, and controller 130 may be configured to control etching chamber 110 according to the process condition set up by processor 120 to carry out the etching process in first chamber 112 and the etching initiation process in second chamber 114.

In exemplary embodiments, processor 120, controller 130, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like. As such, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, processor 120, controller 130, and/or one or more components thereof may include or otherwise be associated with one or more memories (not shown) including code (e.g., instructions) configured to cause processor 120, controller 130, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

An exemplary plasma etching process will be described in more detail in association with FIGS. 2 and 3.

Figure 2:
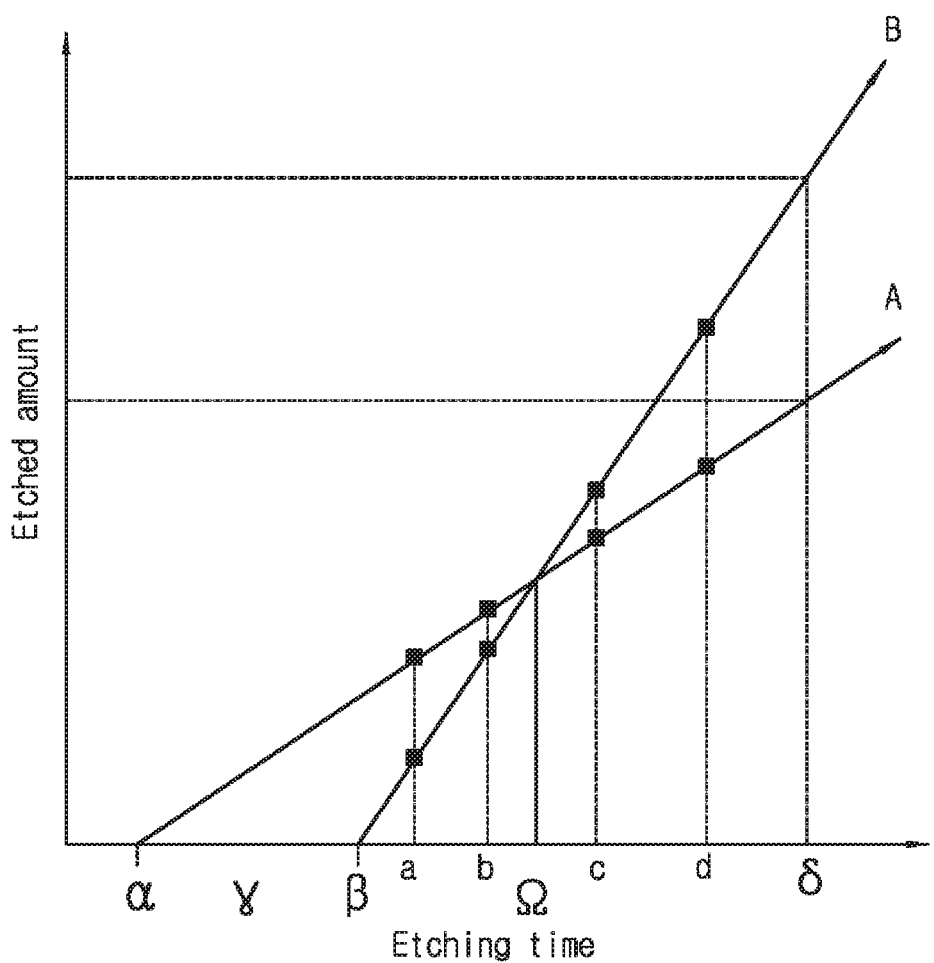
FIG. 2 is a graph demonstrating the operation of the plasma etching apparatus of FIG. 1, according to one or more exemplary embodiments.

FIG. 2 is a graph demonstrating the operation of the plasma etching apparatus of FIG. 1A, according to one or more exemplary embodiments.

A process condition configuration refers to a preliminarily analyzing process during which the incubation times of each material layer may be estimated before the etching process begins. The operation of etched amount measuring device 122, incubation time analyzer 124, and etching time configurator 126 included in processor 120 may be demonstrated with reference to FIG. 2.

Referring to FIGS. 1 and 2, first material layer A and second material layer B are disposed on substrate 115, which is disposed in first chamber 112. It is noted that first material layer A and second material layer B are disposed on the same substrate, however, exemplary embodiments are not limited thereto. For instance, first material layer A and second material layer B may be disposed on different substrates, but first material layer A and second material layer B may be etched under substantially identical process conditions including the ionized etching gas and etching time. Substrate 115, on which first material layer A and second material layer B are disposed, is disposed in first chamber 112, and after the etching gas is introduced and the plasma etching process begins by providing the high frequency power, etched amount measuring device 122 may be configured to measure etched amounts of first material layer A and second material layer B at or after one or more determined times (or time intervals). The etched amount of first material layer A and second material layer B may be measured under identical conditions of the etching process.

Referring to FIG. 2, etched amount measuring device 122 is configured to measure the etched amount of first material layer A and second material layer B at certain time intervals, e.g., time intervals a, b, c, and d, past the determined time after execution of the etching process in first chamber 112. Etched amount measuring device 122 may include a metrology device. For example, etched amount measuring device 122 may include an Optical Critical Dimension (OCD) measuring device. It is contemplated, however, that any suitable metrological measuring device may be utilized in association with exemplary embodiments described herein. An OCD measuring device may be configured to measure the etched amount by generating light having multiple wavelengths using a white light source, and radiating the light having multiple wavelengths onto the substrate 115 on which each material layer is disposed. It is noted that the OCD measuring device may include a spectrometer configured to analyze the light reflected from substrate 115. The OCD measuring device may further include a beam splitter configured to disperse and analyze the light reflected from substrate 115. To this end, the OCD measuring device may measure the reflectivity for each wavelength and measure the etched amount of each material layer. In this manner, the etched amount of each material layer may be considered metrological etching information, and may be stored in any suitable memory.

The etched amount of each of the material layers measured at certain light intervals by etched amount measuring device 122 may be transferred to incubation time analyzer 124. Incubation time analyzer 124 may be configured to extrapolate the etched amount of each material layers to estimate an incubation time. The incubation time may refer to time period after which the material layer reacts with the etching gas and generate byproduct. In other words, the incubation time refers to the minimum time for the etching gas and the material layer to react.

Referring to FIG. 2, incubation time analyzer 124 may be configured to analyze the etched amount measured by etched amount measuring device 122 and extrapolate linear etch graph, and estimate that the incubation time is the point of the x-axis where the generated linear etch graph crosses the x-axis. According to the exemplary embodiment, etched amount measuring device 122 is configured to analyze the incubation time based on the assumption that the etched amount is linear to the measure time, but the exemplary embodiment are not limited thereto.

Incubation time analyzer 124 is configured to analyze the incubation time of the material layer based on the etched amount of the material layer measured to the measure time by etched amount measuring device 122 under the process condition including the etching gas, a pressure in the chamber, applied high frequency power, etc.

According to the exemplary embodiment, slopes of the linear etch graphs of each material layers generated by incubation time analyzer 124 represent etch rates of each material layers corresponding to the etching gas. Referring to FIG. 2, the slope of the linear etch graph of first material layer A is smaller than the slope of the linear etch graph of second material layer B, and therefore, the etch rate of first material layer A is smaller than the etch rate of second material layer B.

According to the exemplary embodiment, the linear etch graphs of the each material layers are merely exemplary under a specific exemplary process condition, and therefore, the linear etch graphs may be controlling by changing the process condition including composition of the etching gas and the pressure in the chamber.

Referring to FIG. 2, incubation time analyzer 124 may determine first incubation time $\alpha$ of first material layer A and second incubation time $\beta$ of second material layer B. First incubation time $\alpha$ and second incubation time $\beta$ are different from each other, and second incubation time $\beta$ may be sufficiently greater than first incubation time $\alpha$.

First material layer A and second material layer B are not etched before the respective incubation times, and first material layer A starts to get etched after first incubation time $\alpha$. Between first incubation time $\alpha$ and second incubation time $\beta$, only first material layer A is etched, and second material layer B is not etched. After second incubation time $\beta$, both of first material layer A and the second material layer B are etched.

Referring to FIG. 2, the slope of the linear etch graph of second material layer B is greater than the slope of the linear etch graph of first material layer A, two linear etch graphs cross each other at time $\Omega$. Accordingly to the exemplary embodiment, although first incubation time $\alpha$ of first material layer A is smaller than second incubation time $\beta$ of second material layer B, since the etch rate of first material layer A is smaller than the etch rate of second material is layer B, at time $\Omega$ after second incubation time $\beta$, the etch amounts of first material layer A and second material B may be substantially identical.

After time $\Omega$, the etched amount of first and second layers A and B is reversed, and the etched amount of second material layer B is greater than the etched amount of first material layer A. Referring to FIG. 2, at time $\delta$, the etched amount of second material layer B is greater than the etched amount of first material layer A.

Accordingly, the incubation time information including first incubation time α and second incubation time β analyzed by first incubation time analyzer 124 is transferred to etching time configurator 126. Etching time configurator 126, in response to first incubation time α of first material layer A and second incubation time β of second material layer B analyzed by incubation time analyzer 124, may determine the unit etching time during which the etching process is carried out in first chamber 112. More specifically, etching time configurator 126 may set unit etching time γ between first incubation time α and second incubation time β.

In this case, first material layer A is an etching target material layer, and second material layer B may be a mask pattern, which is configured to guide a pattern of first material layer A.

According to the exemplary embodiment, by setting unit etching time γ between first incubation time α and second incubation timeβ (α<γ<β), only first material layer A is etched and second material layer B is not etched during the etching process in first change 112. Therefore, according to unit etching time γ, the etching selectivity of first material layer A to second material layer B may be substantially improved. Also, first material layer A is etched only during unit etching time γ, the etching selectivity may be substantially constant. According to the exemplary embodiment, the plasma etching process may be carried out maintaining relatively high etching selectivity.

Figure 3:
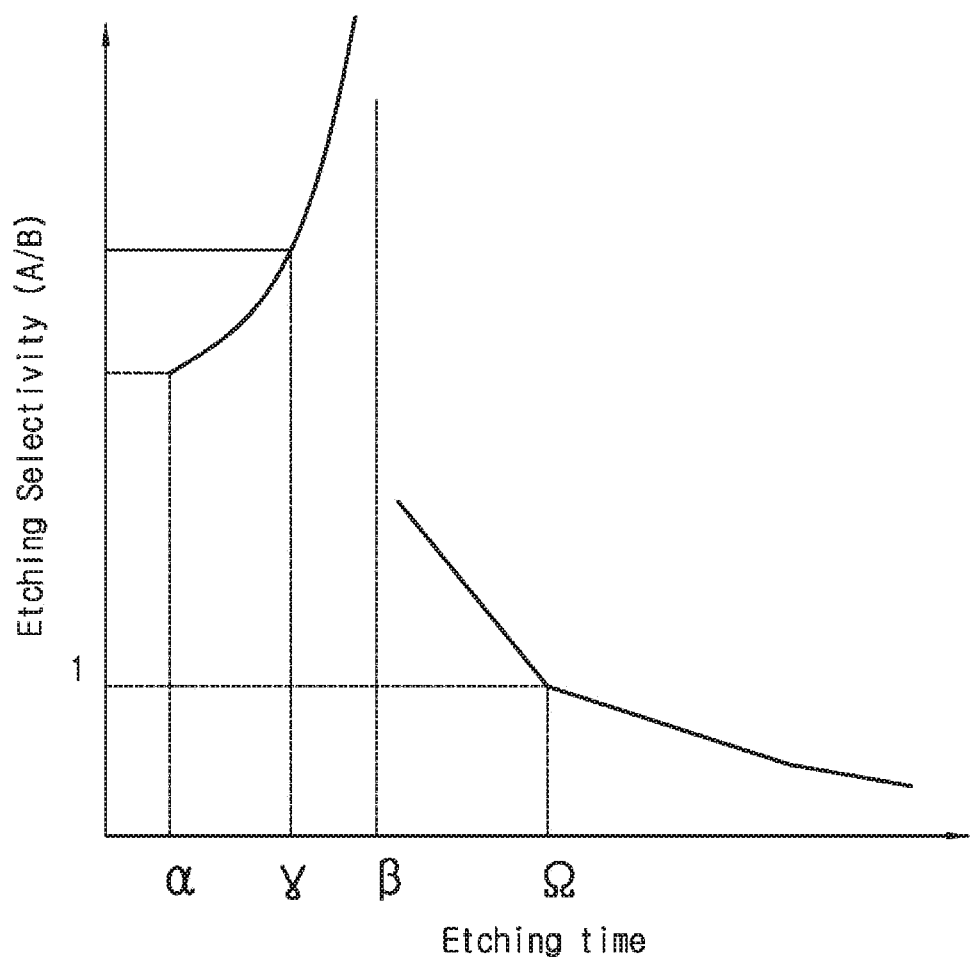
FIG. 3 is a graph illustrating an etching selectivity corresponding to the graph of FIG. 2, according to one or more exemplary embodiments.

FIG. 3 is a graph illustrating an etching selectivity corresponding to the graph of FIG. 2, according to one or more exemplary embodiments.

Referring to FIG. 3, first material layer A reacts with the etching gas after first incubation time α, so only first material layer A is etched and second material layer B is not etched between first incubation time α and second incubation time β. Accordingly, the etching selectivity of first material layer A to second material layer B may be substantially high between first incubation time α and second incubation time β.

Therefore, as etching time configurator 126 sets up unit etching time γ of the etching process to be between first incubation time α and second incubation time β, the plasma etching process may be carried out stably maintaining the etching selectivity of first material layer A to second material layer B.

Referring back to FIG. 2, the etching rate of second material layer B may be substantially greater than the etching rate of first material layer A, but after second incubation time β, the etching selectivity of second material layer B reverses and the etching selectivity of second material layer B to first material layer A decreases.

In other words, first incubation time α of first material layer A is smaller than second incubation time β of second material layer B, but the etch rate of first material layer A is smaller than the etch rate of second material layer B, and therefore, the etching selectivity reverses after second incubation time β, and the etching selectivity may be 1 at time Ω.

Figure 4:
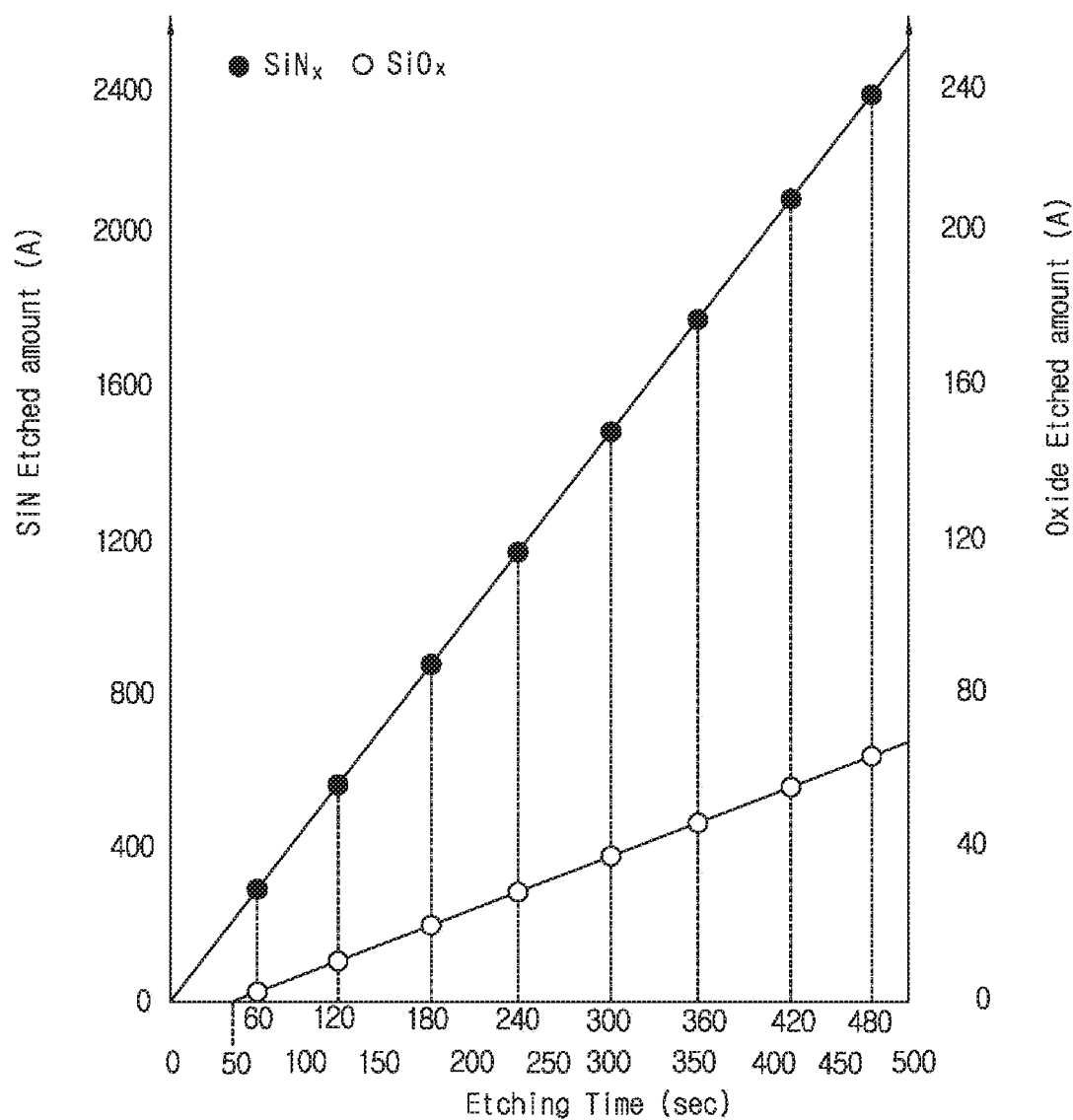
FIG. 4 is a graph comparing etched amount of different material layers and etching time, according to one or more exemplary embodiments.

FIG. 4 is a graph comparing etched amount of different material layers and etching time, according to one or more exemplary embodiments.

According to the exemplary embodiment, the etching gas introduced to first chamber 112 may include, but not limited to, difluoromethane ($CH_2F_2$), nitrogen trifluoride ($NF_3$), nitrogen gas ($N_2$), and oxygen ($O_2$). In this case, the difluoromethane ($CH_2F_2$) may be supplied at substantially between 10 SCCM and 500 SCCM, the nitrogen trifluoride ($NF_3$) may be supplied at substantially between 0 SCCM and 1000 SCCM, the nitrogen gas ($N_2$) may be supplied at substantially between 100 SCCM and 2500 SCCM, and the oxygen ($O_2$) may be supplied at substantially between 100 SCCM and 2500 SCCM.

In this case, the process condition may include temperature of substrate support substantially between 0° C. and 70° C., power supplied to the first chamber substantially between 1000 W and 3000 W, and pressure of the first chamber substantially between 300 mT and 1000 mT.

Referring to FIG. 4, substrate 115 including a silicon nitride ($SiN_X$) layer and a silicon oxide ($SiO_X$) layer is transferred into first chamber 112, and the etching process is carried out using the etching gas introduced into first chamber 112 and the supplied high frequency power, after certain processing time, etched amount measuring device 122 may measure the etched amounts of the silicon nitride ($SiN_X$) and the silicon oxide ($SiO_X$).

According to the exemplary embodiment, FIG. 4 illustrates 8 measuring results measured at 60 seconds interval after 60 seconds, and the etched amount of each material layer measured at certain time interval by etched amount measuring device 122 may be transferred to incubation time analyzer 124.

Incubation time analyzer 124 is configured to extrapolate the etched amount of the each material layers to estimate the incubation time.

Referring to FIG. 4, the 2 graph lines are respectively drawn by connecting the etched amount measured by etched amount measuring device 122, the incubation time may be estimated at the point where the two lines cross the x-axis.

Referring to FIG. 4, the incubation time of the silicon nitride ($SiN_X$) is substantially 0 second, and the incubation time of the silicon oxide ($SiO_X$) is substantially 50 seconds. Slopes of the graph lines illustrated in FIG. 4 generated by incubation time analyzer 124 may represent the etch rate of each material layers to the etching gas. Therefore, under the process condition illustrated in FIG. 4, the slope of the graph line corresponding to the silicon nitride ($SiN_X$) is greater than the slope of the graph line corresponding to the silicon oxide ($SiO_X$), the etch rate of the silicon nitride ($SiN_X$) is greater than the etch rate of the silicon oxide ($SiO_X$).

The incubation time of the silicon nitride ($SiN_X$) and the incubation time of the silicon oxide ($SiO_X$) are different from each other, and the incubation time of the silicon oxide ($SiO_X$) is substantially greater than the incubation time of the silicon nitride ($SiN_X$). Therefore, etching time configurator 126 may set the unit etching time for first chamber 112 based on the incubation time of the silicon nitride ($SiN_X$) and the incubation of the silicon oxide ($SiO_X$) estimated by incubation time analyzer 124.

According to the exemplary embodiment, etching time configurator 126 may set the unit etching time between the incubation time of the silicon nitride ($SiN_X$) and the incubation time of the silicon oxide ($SiO_X$), for example, 40 seconds.

Accordingly, the silicon nitride ($SiN_X$) layer is the etching target material layer, and the silicon oxide ($SiO_X$) layer may provide a guide a pattern on the silicon nitride ($SiN_X$) (e.g., mask pattern). In this case, by setting the unit etching time between the incubations times of the silicon nitride ($SiN_X$) and the silicon oxide ($SiO_X$), only the silicon nitride ($SiN_X$) layer is etched and the silicon oxide ($SiO_X$) is not etched during the unit etching time. Therefore, according to the unit etching time, the etching selectivity of the silicon nitride ($SiN_X$) layer to the silicon oxide ($SiO_X$) layer is substantially high. The silicon nitride ($SiN_X$) layer is etched only during the unit etching time, the etching selectivity may be substantially constant. According to the exemplary embodiment, the plasma etching process may be carried out maintaining relatively high etching selectivity.

According to the exemplary embodiment, the etching process might require an etching time greater than the unit etching time, for example 40 seconds. In other words, etching process for a single unit etching time may be substantially insufficient to form the pattern on the silicon nitride (SiNX) layer.

According to the exemplary embodiment, the etching process may be repeatedly carried out in first chamber 112. Controller 130 may be configured to control etching chamber 110 including first chamber 112 and second chamber 114 according to the process condition, which is set by processor 120, including the unit etching time during which the etching process is continuously carried out.

Specifically, controller 130, is configured to control first chamber 112 to carry out the etching process for the unit etching time, and control second chamber 114 to carry out the etching initiation process after the unit etching time.

For example, if processor 120 sets unit etching time as 40 seconds, controller 130 may control etching chamber 110 so that the etching process is carried out for 40 seconds in first chamber 112, and, after 40 seconds, the substrate including the material layer may be transferred to second chamber 114 to carry out the etching initiation process.

Accordingly, the etching process and the etching initiation process may be alternatingly repeated for a total etching time until the pattern is formed on the silicon nitride (SiN$_x$) layer.

Figure 5:
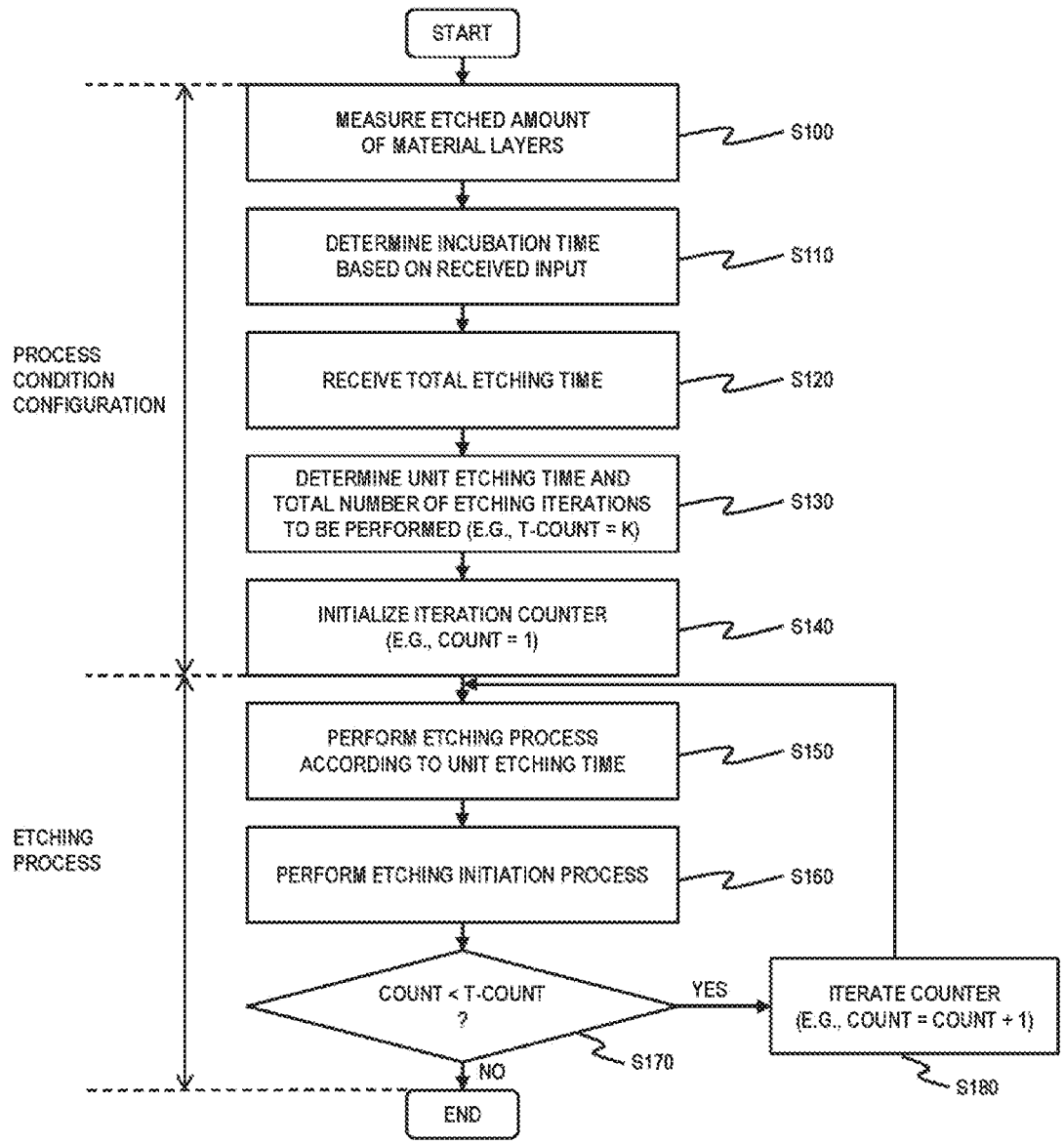
FIG. 5 is a flowchart of a plasma etching process, according to one or more exemplary embodiments.

FIG. 5 is a flowchart of a plasma etching process, according to one or more exemplary embodiments. For descriptive convenience, the process of FIG. 5 is described in association with the plasma etching apparatus of FIG. 1A and the graph of FIG. 2. To this end, the plasma etching process of FIG. 5 assumes that a total etching time is an input to plasma etching apparatus 100.

The plasma etching process includes a process condition configuration and etching process. The process condition configuration is carried out by processor 120, and the etching process is carried out by etching chamber 110 including first and second chambers 112 and 114, and controlled by, for instance, controller 130. The process condition configuration refers to a preliminary analyzing process during which the incubation times of each material layer (e.g., first and second material layers A and B) is estimated before the etching process.

In the step S100, substrate 115, on which first material layer A and second material layer B are disposed, is disposed in first chamber 112. After the etching gas is introduced and the plasma etching process is initiated by providing high frequency power to electrode 118 and substrate support 119, etched amount measuring device 122 is configured to measure the etched amounts of first material layer A and second material layer B after predetermined time.

According to one or more exemplary embodiments, the etched amount of first material layer A and second material layer B under substantially identical process conditions and etching time may be measured. Etched amount measuring device 122 is configured to transfer the information about the etched amount of each material layer to incubation time analyzer 124.

Incubation time analyzer 124 may be configured to, per step S110, estimate (or otherwise determine) the incubation time of each material layer, e.g., an incubation time for material layer A and an incubation time for material layer B, based on the received input. The incubation time may refer to a time period after which a material layer reacts with the etching gas and generates byproduct. In other words, the incubation time refers to the minimum time for the etching gas and the material layer to react. Before reaction, the material layer may be considered to be in an incubation state. The determined incubation times may be stored in, for instance, memory 128.

Referring back to FIG. 2, incubation time analyzer 124 may be configured to analyze the etched amount measured by etched amount measuring device 122 and extrapolate the data to generate a linear etch graph. To this end, incubation time analyzer may estimate that the incubation time is the point on the x-axis where the generated linear etch graph crosses the x-axis. The incubation time information of each material layer is analyzed by incubation time analyzer 124 and is transferred to etching time configurator 126.

In step S120, user interface module 127 may be configured to provide a user interface configured to receive the total etching time (which may define an etching time requested to form the pattern). User interface module 127 may include (or otherwise be associated with) an input device (e.g., touch screen, keyboard, mouse, etc.) through which an operator may input the process condition and a screen through which the received process condition may be shown. The received total etching time may be transferred to and stored in memory 128.

The incubation time information of each material layer and the total etching time may be provided to etching time configurator 126. Based on the incubation time of first material layer A and the incubation time of second material layer B, etching time configurator 126 is configured to determine, per step S130, a unit etching time during which an etching process (e.g., an iterative etching process) is to be performed in, for instance, first chamber 112. Accordingly, through the process condition configuration, which refers to a preliminarily analyzing process during which the incubation times of each material layer is estimated before the etching process, the unit etching time is set.

Furthermore, etching time configurator 126 may be configured to calculate (or otherwise determine) a total number of etching iterations to be performed based on the input total etching time and the determined unit etching time. For instance, etching time configurator 126 may be configured to receive the total etching time stored in memory 128 to determine a total number of etching iterations T-COUNT to be performed based on the determined unit etching time. For example, if etching time configurator 126 determines the unit etching time to be 40 seconds and the total etching time stored in memory 128 is 200 seconds, etching time configurator 126 may determine the total number of etching iterations T-COUNT to be 5. The total number of etching iterations T-COUNT may be stored in memory 128.

Etching time configurator 126 may initialize, in step S140, an iteration counter COUNT via memory 128 and/or controller 130. For example, etching time configurator 126 may initialize the iteration counter to 1, which may be stored in memory 128, set in controller 130, and/or configured in association with component(s) of etching chamber 110.

As previously mentioned, substrate 115 (including material layer A and material layer B) is disposed in first chamber 112. As such, controller 130 is configured to control one or more aspects of etching chamber 110 to perform the etching process according to the unit etching time stored in memory 128, per S150. During the unit etching time, only first material layer A is etched and second material layer B is not etched, e.g., second material layer B remains in an incubation state. In this manner, execution of the etching process for the unit etching time enables the etching selectivity of first material layer A to second material layer B to be relatively and substantially high. Also, since only first material layer A is etched during the unit etching time, the etching selectivity may be substantially constant. According to one or more exemplary embodiments, the plasma etching process may be carried out maintaining relatively high etching selectivity.

It is noted, however, that the etching process might have a total etching time greater than the unit etching time. As such, controller 130 may be configured to control etching chamber 110 so that substrate 115 is transitioned between first chamber 112 and second chamber 114 via connection channel 113. Further, controller 130 may control second chamber 114 to perform an etching initiation process, in step S160. The etching initiation process may include a purging process during which etching byproduct is purged from chamber 110. As previously mentioned, etching chamber 110 may include only one chamber, and, as such, the etching process and the etching initiation process may be alternatingly repeated in a single chamber.

Controller 130 is further configured to determine whether the etching process is to be repeated, per step S170. That is, controller 130 may determine whether the iteration counter COUNT is less than the total number of etching iterations T-COUNT. If COUNT is less than T-COUNT, the etching process is to be repeated and controller 130 may iterate (in step S180) the iteration counter COUNT, e.g., COUNT=COUNT+1. The new iteration count COUNT may be stored in any suitable memory, such as memory 128.

According to one or more exemplary embodiments, substrate 115 may be transitioned from second chamber 114 to first chamber 112 via connection channel 113 to carry out another etching process according to the unit etching time. In this manner, steps S150 to S180 may be repeated until the iteration counter COUNT is equal to the total number of iterations to be performed T-COUNT. For instance, according to the above-noted example, steps S150 to S180 may be repeated five times until the iteration counter COUNT is 5. Once the iteration counter COUNT is equal to the total number of iterations to be performed T-COUNT, the total etch time is achieved and the entire etching process may be complete.

Figure 6:
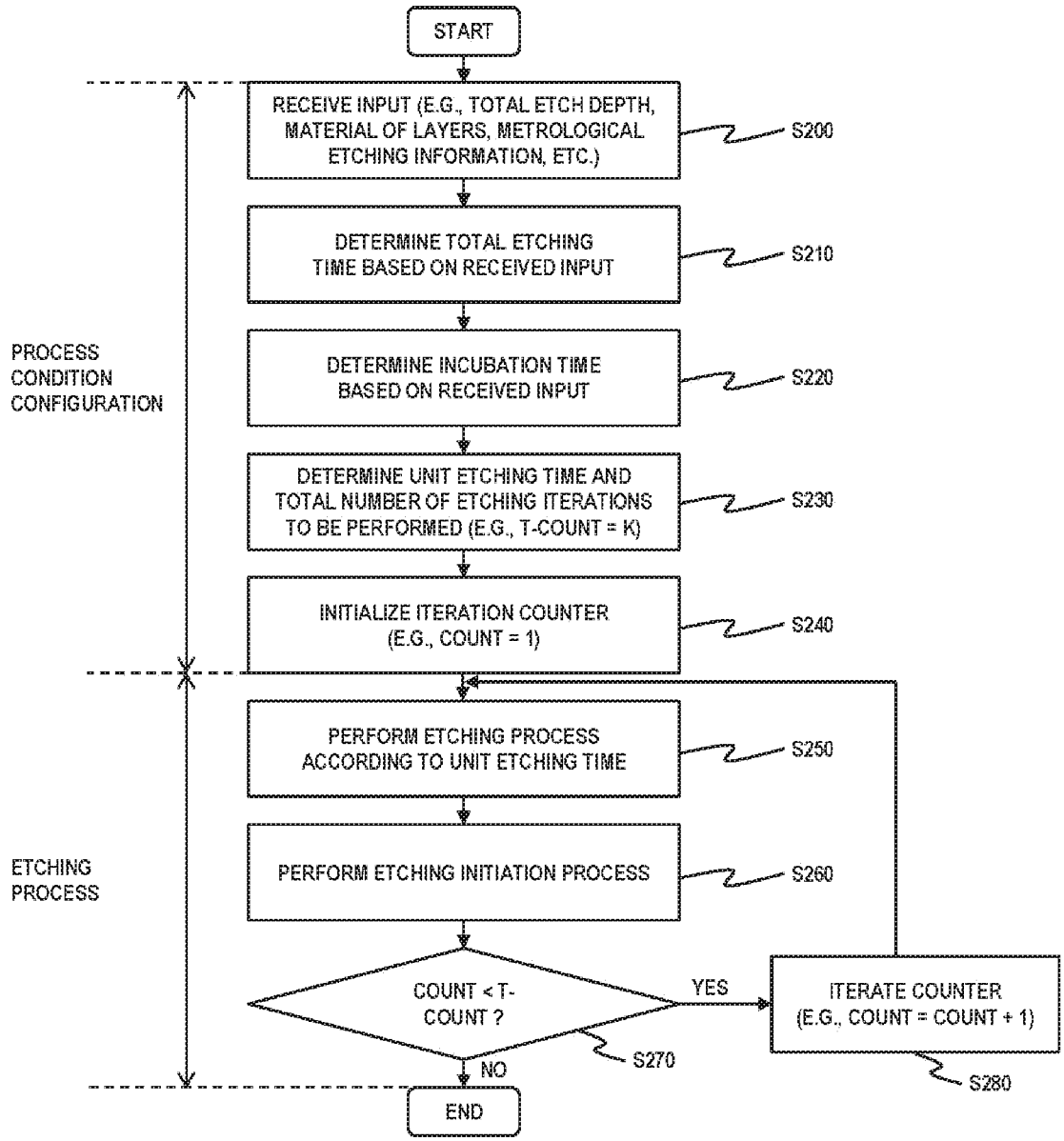
FIG. 6 is a flowchart of a plasma etching process, according to one or more exemplary embodiments.

FIG. 6 is a flowchart of a plasma etching process, according to one or more exemplary embodiments. For descriptive convenience, the plasma etching process of FIG. 6 will be described with reference to FIGS. 1 and 2. Further, it is assumed that substrate 115 (including first material layer A and second material layer B) is disposed in first chamber 112. It is also assumed that design information (e.g., the materials of first and second material layers A and B, total etch depth, etc.) is input to plasma etching apparatus 100.

Referring to FIGS. 1 and 6, user interface module 127 may be configured to provide a user interface to receive (at step S200) input, e.g., the process condition and/or other design information including, but not limited to, the total etching time, the unit etching time, a total etch depth to be achieved, a material layer to be etched, other layers on substrate 115, metrological etching information about the material layer to be etched, etc., from a user, etched amount measuring device 122, one or more databases (e.g., one or more manufacturing databases), and/or the like. As previously described, user interface module 127 may include an input device through which an operator may input, retrieve, modify, etc., one or more parameters and a screen through which the one or more parameters may be shown. Memory 128 may be configured to receive and store the one or more parameters. User interface module 127 and/or memory 128 may be configured to provide the one or more parameters to etching time configurator 126.

In step 210, user interface module 127 and/or one or more other components of processor 120 (e.g., etching time configurator 126) may be configured to determine a total etching time based on the received input, e.g., may be configured to determine a total etching time based on a total etch depth to be achieved, the materials of first material layer A and second material layer B, the etching conditions to be provided via chamber 110, etc. The total etching time may be stored in, for instance, memory 128 or any other suitable memory accessible to plasma etching apparatus 100. To this end, one or more components of processor 120 (e.g., user interface module 127 and incubation time analyzer 124) may be configured to, per step S220, determine the incubation time of each material layer, e.g., an incubation time for material layer A and an incubation time for material layer B, based on the received input. For instance, user interface module 127 and/or incubation time analyzer 124 may be configured to retrieve incubation times corresponding to the received inputs from memory 128 or any other suitable repository including historical information about plasma etching first and second material layers A and B according to the etching conditions to be provided via chamber 110.

The incubation time information of each material layer may be provided to etching time configurator 126. Based on the incubation time of first material layer A and the incubation time of second material layer B, etching time configurator 126 is configured to determine, per step S230, a unit etching time during which an iterative etching process is to be performed in, for instance, first chamber 112. Furthermore, etching time configurator 126 may be configured to calculate (or otherwise determine) a total number of etching iterations to be performed to achieve the total etch depth based on the unit etching time. For instance, etching time configurator 126 may be configured to receive the total etching time stored in memory 128 (or ported from user interface module 127) to determine a total number of etching iterations T-COUNT to be performed based on the determined unit etching time. For example, if etching time configurator 126 determines the unit etching time to be 40 seconds and the total etching time stored in memory 128 is 200 seconds, etching time configurator 126 may determine the total number of etching iterations T-COUNT to be 5. The total number of etching iterations T-COUNT may be stored in memory 128 or any other suitable repository.

Etching time configurator 126 may initialize, in step S240, an iteration counter COUNT via memory 128 and/or controller 130. For example, etching time configurator 126 may initialize the iteration counter to 1, which may be stored in memory 128, set in controller 130, and/or configured in association with component(s) of etching chamber 110.

As previously mentioned, substrate 115 (including material layer A and material layer B) is disposed in first chamber 112. As such, controller 130 is configured to control one or more aspects of etching chamber 110 to perform the etching process according to the unit etching time stored in memory 128, per step S250. For instance, controller 130 may be configured to control first chamber 112 to conduct a plasma etching process. During the unit etching time, only first material layer A is etched and second material layer B is not etched, e.g., second material layer B remains in an incubation state). In this manner, execution of the etching process for the unit etching time enables the etching selectivity of first material layer A to second material layer B to be substantially and relatively high. Also, since first material layer A is etched only during the unit etching time, the etching selectivity may be substantially constant. According to one or more exemplary embodiments, the plasma etching process may be carried out maintaining relatively high etching selectivity.

It is noted, however, that the etching process might have a total etching time greater than the unit etching time. In other words, the etching process according to a single unit etching time may not achieve the total etch depth in first material layer A. As such, controller 130 may be configured to control etching chamber 110 so that substrate 115 is transitioned between first chamber 112 and second chamber 114 via connection channel 113. Further, controller 130 may control second chamber 114 to perform the etching initiation process, in step S260. The etching initiation process may include a purging process during which etching byproduct is purged from chamber 110. As previously mentioned, etching chamber 110 may include only one chamber, and, as such, the etching process and the etching initiation process may be alternatingly repeated in a single chamber.

Controller 130 is further configured to determine whether the etching process is to be repeated, per step S270. That is, controller 130 may determine whether the iteration counter COUNT is less than the total number of etching iterations T-COUNT. If COUNT is less than T-COUNT, the etching process is to be repeated and controller 130 may iterate (in step S280) the iteration counter COUNT, e.g., COUNT=COUNT+1. The new iteration count COUNT may be stored in any suitable memory, such as memory 128.

According to one or more exemplary embodiments, substrate 115 may be transitioned from second chamber 114 to first chamber 112 via connection channel 113 to carry out another etching process according to the unit etching time. In this manner, steps S250 to S280 may be repeated until the iteration counter COUNT is equal to the total number of iterations to be performed T-COUNT. For instance, according to the above-noted example, steps S250 to S280 may be repeated five times until the iteration counter COUNT is 5. Once the iteration counter COUNT is greater than the total number of iterations to be performed T-COUNT, the total etch depth is achieved and the entire etching process may be complete.

According to one or more exemplary embodiments, iterative etching processes may be performed in a plurality of sub-chambers, such as described in association with plasma etching apparatuses 1101 and 1103 of FIGS. 1B and 1C. In this manner, substrate 115 may enter plasma etching apparatus 1101, be successively etched in stages via a plurality of different first sub-chambers $112_1$ to $112_n$ while alternating between the first sub-chambers $112_1$ to $112_n$ and second sub-chamber 114, and exit etching apparatus 1101 once the total etch depth is achieved. As another example, substrate 115 may enter plasma etching apparatus 1103, undergo successive etching then etching initiation stages via a plurality of different sub-chambers $1102_1$ to $1102_n$, and exit etching apparatus 1103 once the total etch depth is achieved. At each successive iteration (or at determined iterations), another substrate may enter etching apparatus 1101 or 1103, such that a plurality of different substrates may be simultaneously etched and successively iterated through the plurality of different first sub-chambers $112_1$ to $112_n$ or sub-chambers $1102_1$ to $1102_n$.

At step S270, controller 130 may determine that the etching process is complete depending on the number of execution times of the etching process and the etching initiation process, and may be configured to repeat the etching process and the etching initiation process until a desired pattern at a desired depth is formed in first material layer A.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method, comprising:
receiving metrological etching information associated with a target;
determining a condition to control plasma etching of the target based on the metrological etching information;
executing, after determining the condition, the plasma etching according to the condition,
causing, at least in part, the target to be disposed in a first chamber for executing the plasma etching; and
causing, at least in part, the target to be disposed in a second chamber for executing an etching initiation process,
wherein the condition comprises a unit etching time over which the plasma etching is to be continuously performed,
wherein the etching initiation process initiates formation of a desired pattern in the target, and
wherein the plasma etching and the etching initiation process are alternated between until the desired pattern is formed.

2. The method of claim 1, further comprising:
measuring etched amounts of at least two material layers of the target, the etched amounts corresponding to the metrological etching information; and
determining, in response to receiving the metrological etching information, respective incubation times of the at least two material layers,
wherein the unit etching time is determined according to the respective incubation times of the at least two material layers, and
wherein each of the respective incubation times is a minimum reaction time for an etching gas and a corresponding material layer of the at least two material layers to react.

3. The method of claim 2, wherein the at least two material layers comprise:
a first material layer to be plasma etched according to a guide pattern; and
a second material layer disposed on the first material layer as the guide pattern.

4. The method of claim 3, wherein:
the first material layer comprises a silicon nitride ($SiN_x$) layer;
the second material layer comprises a silicon oxide ($SiO_x$) layer; and
the etching gas comprises difluoromethane ($CH_2F_2$), nitrogen trifluoride ($NF_3$), nitrogen gas ($N_2$), and oxygen ($O_2$).

5. The method of claim 3, wherein:
the respective incubation times comprise:
a first incubation time of the first material layer; and
a second incubation time of the second material layer; and
the second incubation time is greater than the first incubation time.

6. The method of claim 5, wherein the unit etching time is between the first incubation time and the second incubation time.

7. A method, comprising:
  receiving input to control plasma etching of a first layer, the input comprising design criteria and information about the first layer and a second layer;
  determining, based on some of the input, a first time to plasma etch the first layer;
  determining, based on the information, a second time to continuously plasma etch the first layer with the second layer in an incubation state; and
  causing, at least in part, the plasma etch to be performed according to the second time,
  wherein the plasma etch is repeated k times, and
  wherein k multiples of the second time equals the first time.

8. The method of claim 7, wherein the first layer and the second layer are exposed to etching gas during the plasma etch.

* * * * *